US011315975B2

(12) United States Patent
Yao et al.

(10) Patent No.: US 11,315,975 B2
(45) Date of Patent: Apr. 26, 2022

(54) IMAGE SENSOR AND METHOD FOR MANUFACTURING THE SAME

(71) Applicant: SHENZHEN GOODIX TECHNOLOGY CO., LTD., Shenzhen (CN)

(72) Inventors: Guofeng Yao, Shenzhen (CN); Jian Shen, Shenzhen (CN); Yunning Li, Shenzhen (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 202 days.

(21) Appl. No.: 16/687,689

(22) Filed: Nov. 19, 2019

(65) Prior Publication Data

US 2020/0168645 A1 May 28, 2020

Related U.S. Application Data

(63) Continuation of application No. PCT/CN2018/117194, filed on Nov. 23, 2018.

(51) Int. Cl.
*H01L 27/146* (2006.01)
(52) U.S. Cl.
CPC .... *H01L 27/1464* (2013.01); *H01L 27/14625* (2013.01); *H01L 27/14643* (2013.01); *H01L 27/14683* (2013.01)
(58) Field of Classification Search
CPC ........... H01L 27/1464; H01L 27/14683; H01L 27/14625; H01L 27/14643
See application file for complete search history.

(56) References Cited

U.S. PATENT DOCUMENTS 6,498,336 B1 12/2002 Tian et al.
8,716,823 B2 5/2014 Lenchenkov
(Continued)

FOREIGN PATENT DOCUMENTS

CN 102157534 A 8/2011
CN 102222674 A 10/2011
(Continued)

OTHER PUBLICATIONS

First Office Action for the corresponding KR application No. 10-2019-7034475, dated Apr. 23, 2021, 5 pages total.
(Continued)

*Primary Examiner* — Thanh Luu
(74) *Attorney, Agent, or Firm* — USCH Law, PC

(57) ABSTRACT

The present disclosure provides an image sensor including a substrate (400) and at least one pixel unit. The pixel unit comprises a photodetector (401) arranged in the substrate, a photosensitive surface of the photodetector facing a back surface of the substrate to generate a charge upon receiving an incident light from the back surface of the substrate, a spherical crown structure (406) arranged on the substrate and located on an opposite surface of the photosensitive surface, a conformal dielectric layer (420) arranged on the spherical crown structure and used to generate a dielectric-layer reflective light when the incident light reaches the conformal dielectric layer, and a reflective layer (430) arranged on the conformal dielectric layer and used to generate a reflective-layer reflective light when the incident light reaches the reflective layer. In this way, an absorption ratio for the incident light is increased, thereby improving signal quality of an image.

20 Claims, 8 Drawing Sheets

(56) References Cited

U.S. PATENT DOCUMENTS

| | | | |
|---|---|---|---|
| 2010/0140637 A1* | 6/2010 | Donofrio | H01L 33/42 |
| | | | 257/98 |
| 2011/0049330 A1 | 3/2011 | Adkisson et al. | |
| 2011/0254115 A1* | 10/2011 | Shih | H01L 27/14685 |
| | | | 257/432 |
| 2014/0120653 A1 | 5/2014 | Zhao | |
| 2017/0229503 A1 | 8/2017 | Suzuki et al. | |
| 2019/0057994 A1* | 2/2019 | Huang | H01L 27/14627 |
| 2019/0312075 A1* | 10/2019 | Yamamoto | H04N 5/369 |
| 2020/0075657 A1* | 3/2020 | Huang | H01L 27/14612 |

FOREIGN PATENT DOCUMENTS

| | | |
|---|---|---|
| CN | 108847418 A | 11/2018 |
| EP | 1916714 A1 | 4/2008 |
| JP | H08181297 A | 7/1996 |
| JP | 2011091128 A | 5/2011 |
| JP | 2011114150 A | 6/2011 |
| KR | 20110017066 A | 2/2011 |
| KR | 20110023741 A | 3/2011 |

OTHER PUBLICATIONS

First Office Action for the corresponding JP application No. 2019-564061, dated Mar. 19, 2021, 4 pages total.
Extended European Search Report for the corresponding EP application No. 18918406.2, dated Jul. 10, 2020, 7 pages total.
Notice of Allowance by Korean Intellectual Property Office, KR 10-2019-7034475, dated Oct. 13, 2021, 3 pages.

* cited by examiner

IMAGE SENSOR AND METHOD FOR MANUFACTURING THE SAME

CROSS REFERENCE TO RELATED APPLICATIONS

The present application is a continuation of international application No. PCT/CN2018/117194, filed on Nov. 23, 2018, which is hereby incorporated by reference in its entirety.

TECHNICAL FIELD

The present disclosure relates to image sensor technologies, and in particular to an image sensor and a method for manufacturing the image sensor.

BACKGROUND

CMOS image sensors are widely applied to devices such as mobile phones, digital cameras, driving recorders and security monitoring devices. A working principle of CMOS image sensor is based on the photoelectric conversion effect. When light projects on a pixel array in an image sensor, each pixel unit generates charges of a corresponding quantity in accordance with a light strength at a corresponding position. The charges then convert to a digital signal. Finally, signals of all pixel units are processed and output as an image. Based on structure, the CMOS image sensors can be classified into front-illuminated image sensors and back-illuminated image sensors. For a back-illuminated image sensor, since an incident light directly projects on a photosensitive area from a back surface, the back-illuminated image sensor is more responsive than a front-illuminated image sensor.

A circuit diagram of a pixel unit of a common back-illuminated image sensor in the existing technologies includes, as shown in FIG. 1, a photodiode 11 and four transistors 12, 14, 16 and 18. Herein the transistor 12 controls transmission of charges generated by the photodiode 11 to a floating diffusion node. The area in the dotted box is a schematic structure of a pixel unit structure 10. With reference to FIG. 2, a photodiode 101 (i.e., the photodiode 11 in FIG. 1) and a floating diffusion node 102 (i.e., 13 as in FIG. 1) are included on a silicon substrate 100. A gate structure 105 of a transmission transistor is arranged on the silicon substrate 100. An incident light 140 projects on the photodiode 101 from a back surface of the silicon substrate 100 and generates charges.

The inventor finds that at least the following problem exists in the existing technologies: in recent years, new technologies such as AR/VR and 3D face recognition are emerging; since these technologies mostly apply infrared light which is visible to human eyes as a light source (for example, an Apple iphone X lattice projection module that applies a vertical cavity surface emitting laser (VCSEL) of 940 nm as a light source), Thus, requirements on image sensors that are highly responsive to infrared light are increasing. Compared with a waveband of a visible light, an infrared light has a longer wavelength and a lower absorption ratio in a photodiode. When silicon is thinner, some infrared light would penetrate through the silicon. For example, 141 as shown in FIG. 2 is the light that cannot be absorbed and thus penetrates through the silicon. Therefore, a problem to a traditional back-illuminated image sensor is that the absorption ratio of the traditional back-illuminated image sensor for incident light is lower, thereby resulting in undesired quality of an image signal.

SUMMARY

Some embodiments of the present disclosure provide an image sensor and a manufacturing method for the image sensor, for the purpose of increasing an absorption ratio of the image sensor for incident light and improving quality of an image signal.

Embodiments of the present disclosure provide an image sensor including a substrate and at least one pixel unit. The pixel unit includes a photodetector arranged in the substrate, a photosensitive surface of the photodetector facing a back surface of the substrate to generate a charge upon receiving an incident light from the back surface of the substrate, a spherical crown structure arranged on the substrate and located on an opposite surface of the photosensitive surface, a conformal dielectric layer arranged on the spherical crown structure and used to generate a dielectric-layer reflective light when the incident light reaches the conformal dielectric layer, and a reflective layer arranged on the conformal dielectric layer and used to generate a reflective-layer reflective light when the incident light reaches the reflective layer.

Embodiments of the present disclosure further provides a manufacturing method for an image sensor including: providing a substrate, wherein a photodetector is formed in the substrate and a photosensitive surface of the photodetector faces a back surface of the substrate; forming a spherical crown structure on the substrate and on an opposite surface of the photosensitive surface of the photodetector; forming a conformal dielectric layer on the spherical crown structure; and forming a reflective layer on the conformal dielectric layer.

In embodiments of the present disclosure, as compared to the existing technologies, the pixel unit of the image sensor has a spherical crown structure arranged on an opposite surface of the photosensitive surface of the photodetector, and a conformal dielectric layer is arranged on the spherical crown structure and used to generate a dielectric-layer reflective light when the incident light reaches the conformal dielectric layer. The spherical crown structure and the conformal dielectric layer keep an optical path of the incident light that enters the photodetector, penetrates the substrate and arrives at the conformal dielectric layer the same whatever is an angle of the incident light. A dielectric-layer reflective light generated when the incident light arrives at the conformal dielectric layer may enable the incident light that penetrates through the substrate to have an opportunity to return to the photodetector, thereby increasing the absorption of incident lights of varied incident angles. For an incident light that penetrates through the conformal dielectric layer, a reflective-layer reflective light is generated by using the reflective layer arranged on the conformal dielectric layer. In this way, the incident light that arrives at the reflective layer has an opportunity to return to the photodetector, so that the photodetector may take full advantage of incident lights of varied angles, thereby increasing the absorption ratio of the incident lights and increasing signal quality of the image.

For example, the conformal dielectric layer specifically is a multilayer conformal dielectric layer. Herein, two adjacent conformal dielectric layers have different refractive indexes. That is, the conformal dielectric layer may be a structure formed by dielectric materials that have different refractive indexes and that are alternately stacked, thereby further increasing the absorption ratio for light.

In some embodiments, the multilayer conformal dielectric layer specifically is a three-layered conformal dielectric layer. Herein the three-layered conformal dielectric layer consists of a first silicon dioxide dielectric layer located on the spherical crown structure, a titanium dioxide dielectric layer located on the first silicon dioxide dielectric layer, and a second silicon dioxide dielectric layer located on the titanium dioxide dielectric layer.

In some embodiments, the conformal dielectric layer has a preset thickness that satisfies an optical resonance condition of the incident light. By controlling the thickness of the conformal dielectric layer to satisfy the optical resonance condition of the incident light, the incident lights projecting at different angles may be enabled to realize optical resonance in the same structure, which is advantageous for using the incident light to the extreme.

In some embodiments, the phase θ of the dielectric-layer reflective light and the phase φ of the reflective-layer reflective light are specifically calculated by the following formulas:

$$\theta = \frac{2\pi n_d}{\lambda} d,$$

$$\varphi = \arctan\left(\frac{2 n_d k_r}{n_d^2 - n_r^2 - k_r^2}\right);$$

wherein d denotes the preset thickness of the conformal dielectric layer, $n_d$ denotes a refractive index of the conformal dielectric layer, and λ denotes a wavelength of the incident light; $n_r$ denotes a refractive index of the reflective layer, and $k_r$ denotes an extinction coefficient of the reflective layer. The formulas for calculating θ and φ are advantageous for accurately obtaining the present thickness of the conformal dielectric layer in accordance with a relationship between θ and φ.

In some embodiments, the spherical crown structure specifically is a spherical crown silicon structure, which provides a material type of the spherical crown structure.

In some embodiments, the incident light specifically is a near-infrared monochromatic light. In a scenario where the near-infrared monochromatic light which is invisible to human eyes is used as a light source, the absorption ratio for the near-infrared monochromatic light facilitates improving a responsiveness of the image sensor in a near-infrared waveband.

BRIEF DESCRIPTION OF THE DRAWINGS

One or more embodiments are exemplified by the figures in the accompanying drawings. The exemplary description does not constitute a limitation to the embodiments. Elements with the same reference numeral represent similar elements. The figures in the accompanying drawings do not constitute a proportion limitation unless otherwise stated.

DETAILED DESCRIPTION

In order to clarify the objective, the technical solutions and the advantages of the present disclosure, some embodiments of the present disclosure will be further described in details below with reference to the accompanying drawings and embodiments. It shall be understood that the specific embodiments described herein are merely illustrative of the disclosure and are not intended to be limiting. The following various embodiments are provided to facilitate description, and shall not be construed as limiting to specific implementations of the present disclosure. The embodiments may be combined with each other in case of no contradiction.

A first embodiment of the present disclosure relates to an image sensor including: a substrate and at least one pixel unit; a photodetector arranged in the substrate, a photosensitive surface of the photodetector facing a back surface of the substrate to generate a charge upon receiving an incident light from the back surface of the substrate; a spherical crown structure arranged on the substrate and located on an opposite surface of the photosensitive surface; the spherical crown structure and the substrate being of the same material; a conformal dielectric layer arranged on the spherical crown structure and used to generate a dielectric-layer reflective light when the incident light reaches the conformal dielectric layer; and a reflective layer arranged on the conformal dielectric layer and used to generate a reflective-layer reflective light when the incident light reaches the reflective layer, so that an absorption ratio of an incident light may be increased to improve signal quality of the image. Implementation of a pixel unit structure of the image sensor in accordance with this embodiment is described in details in the following, which are provided to facilitate understanding rather than necessities for implementing this solution.

In this embodiment, it is taken as an example that the conformal dielectric layer in the image sensor is a single-layer conformal dielectric layer, to which the present disclosure is not limited in practice. In order to facilitate understanding this embodiment, this embodiment is firstly described in detail in accordance with FIG. 3. It shall be clarified that FIG. 3 aims to facilitate describing varied reflective lights generated among but does not show a shape or structure of a spherical crown structure 300, a single-layer conformal dielectric layer 320 and a reflective layer 330. Herein, a silicon layer is taken as an example for the spherical crown structure, the single-layer conformal dielectric layer may be a silicon dioxide dielectric layer, a titanium dioxide dielectric layer or the like, and the reflective layer is generally metal such as aluminum and silver.

Figure 3:
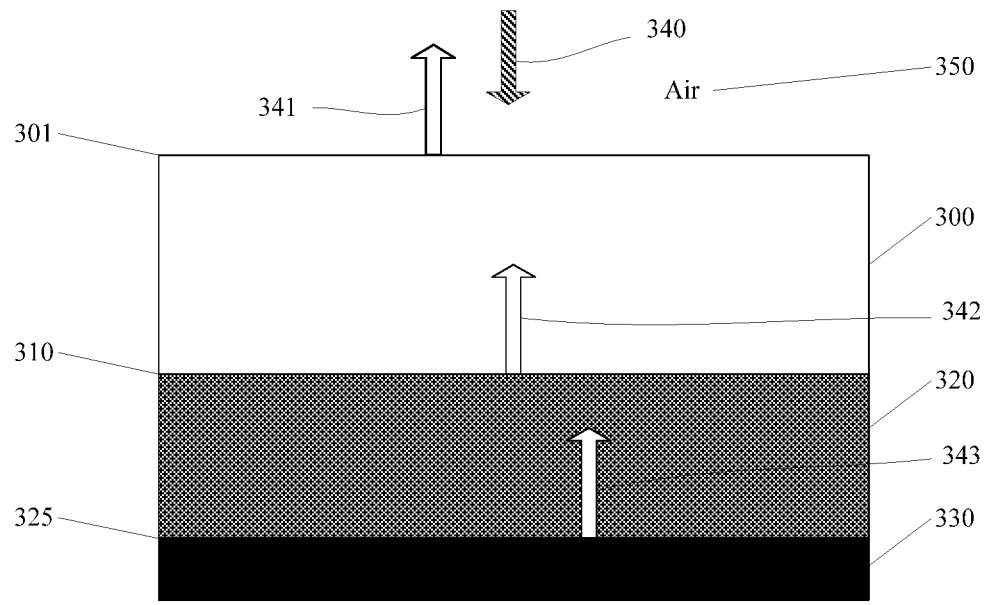
FIG. 3 shows a diagram of a silicon layer—a single-layer conformal dielectric layer—a reflection layer used in an image sensor in accordance with a first embodiment of the present disclosure.

Specifically, as shown in FIG. 3, a beam of single-wavelength incident light 340 projecting perpendicularly generates a reflective light 341 upon arriving at an interface 301 between air 350 and the silicon layer, a reflective light 342 upon arriving at an interface 310 between the silicon layer and the single-layer conformal dielectric layer 320, and a reflective light 343 upon arriving at an interface 325 between the single-layer conformal dielectric layer 320 and the reflective layer 330.

Figure 4:
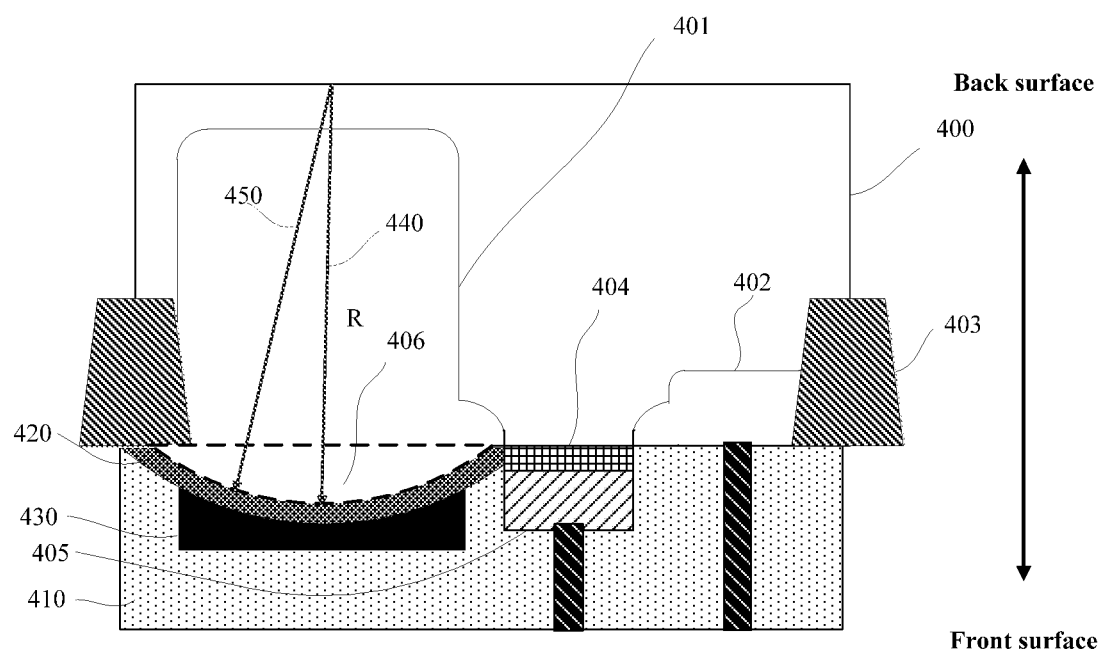
FIG. 4 shows a diagram of a pixel unit structure of an image sensor in accordance with the first embodiment of the present disclosure.

Further, the image sensor in this embodiment includes a substrate 400 and a pixel unit structure as shown in FIG. 4. The image sensor includes a photodetector 401, a floating diffusion node 402, a shallow trench isolator 403, a gate dielectric layer 404, a gate structure 405 of a transmission transistor, a spherical crown structure 406, an inter-layer dielectric layer 410, a single-layer conformal dielectric layer 420 and a reflective layer 430.

Specifically, the substrate 400 may be a silicon substrate with a front surface and a back surface. As shown in FIG. 4, the upward arrow indicates the back surface, while the downward arrow indicates the front surface.

Specifically, the photodetector 401 is arranged in the substrate 400, the photosensitive surface of the photodetector faces the back surface of the substrate 400 to generate a charge upon receiving an incident light from the back surface of the substrate. The incident light may project in at any angle. For example, FIG. 4 shows an incident light 440 projects perpendicularly and an incident light 450 projects non-perpendicularly. Herein, the photodetector 401 in this embodiment may be a photodiode.

Further, with the emergence of new technologies such as AR/VR and 3D face recognition, since most of these technologies use near-infrared light that is invisible to human eyes as a light source, there is an increasing demand for image sensors having high responsiveness to near-infrared light. Compared with a visible light waveband, the near-infrared light has a low absorption ratio in the photodetector due to its longer wavelength. When the thickness of silicon is thin, part of the near-infrared light will penetrate through and out of the silicon, which is not advantageous to use of light. The pixel unit structure of the image sensor in this embodiment makes it possible to allow the near-infrared light that projects at different angles through the silicon layer to return to the photodetector, thereby increasing the absorption of light. That is to say, if the incident light is near-infrared monochromatic light with a wavelength of 780 to 1100 nm, it facilitates improving the responsiveness of the image sensor to the near-infrared band in an application scenario in which a laser with a better monochromaticity is used as a near-infrared light source.

Specifically, the floating diffusion node 402 is arranged in the substrate 400 to store a received charge, and to convert the stored charge to a voltage signal.

Specifically, the shallow trench isolator 403 is arranged on both sides of the substrate 400 to isolate interference by a neighboring pixel unit structure.

Figure 1:
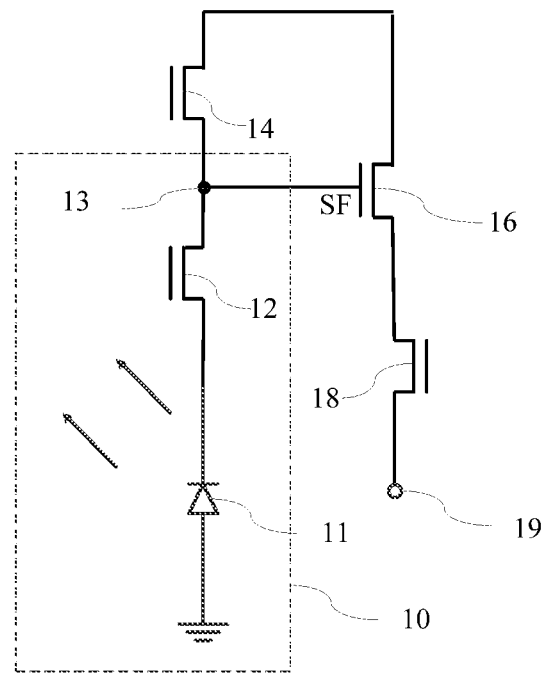
FIG. 1 shows a circuit diagram of a pixel unit in a back-illuminated image sensor in accordance with the background technology in the present disclosure.
Figure 2:
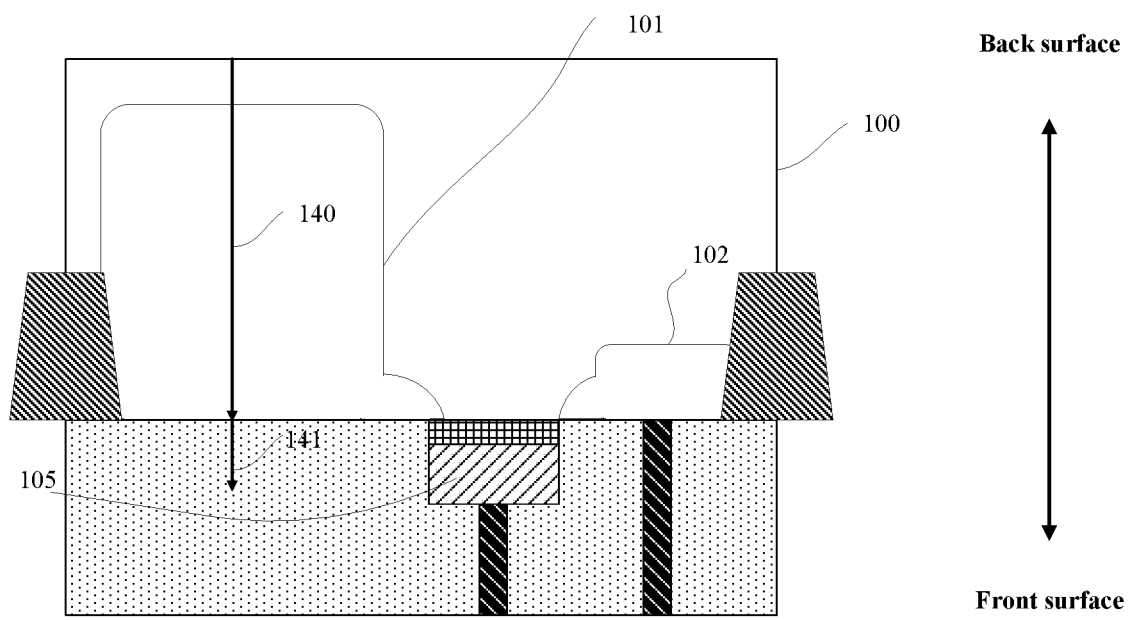
FIG. 2 shows a structural diagram of a pixel unit in a back-illuminated image sensor in accordance with the background technology in the present disclosure.

Specifically, the gate structure 405 of the transmission transistor is arranged on the gate dielectric layer 404 that is arranged on the substrate 400. The transmission transistor is used to control transmission of a charge generated by the photodetector 401 to the floating diffusion node 402, and the gate structure 405 may be taken as a switch to control charge transmission, i.e., to control to start or end the charge transmission. Herein, FIG. 1 shows a gate structure of a transmission transistor 12 which is the gate structure 405 of the transmission transistor shown in FIG. 4.

Specifically, the spherical crown structure 406 may be one with a curvature radius of R. The spherical crown structure 406 and the substrate are of the same material, for example, the material may be a common semiconductor material. Preferably, the substrate in this embodiment is a silicon substrate and the spherical crown structure is a spherical crown silicon structure, to which, however, the present disclosure is not limited in practice. The spherical crown silicon structure is arranged on the substrate 400 and located on the opposite surface of the photosensitive surface of the photodetector 401.

Specifically, the single-layer conformal dielectric layer 420 is arranged on the spherical crown structure and used to generate the dielectric-layer reflective light when the incident light reaches the single-layer conformal dielectric layer 420. The single-layer conformal dielectric layer 420 may be of a certain thickness.

Specifically, the reflective layer 430 is arranged on the single-layer conformal dielectric layer 420 and used to generate the dielectric-layer reflective light when the incident light reaches the reflective layer 430.

It is seen from the above-described pixel unit structure that an optical path to the reflective layer 430 remains the same whichever of the incident light 440 projecting perpendicularly and the incident light 450 projecting non-perpendicularly it is.

Compared with the existing technologies, in this embodiment, a spherical crown silicon structure of a particular curvature radius is formed on an upper area of a surface opposite to an image on a photosensitive surface of the photodetector, and then a single-layer conformal dielectric layer and reflective layer of a particular thickness is formed on the spherical crown silicon structure. The pixel unit structure in this embodiment makes it possible to allow an incident light that penetrates through a silicon layer to return to the photodetector, thereby increasing the absorption of light. Besides, it is ensured that incident lights at different incident angles have the same optical path, thereby optimizing absorption ratios of incident lights at different projecting angles in the photodetector.

A second embodiment of the present disclosure relates to an image sensor. In this embodiment, a conformal dielectric layer has a preset thickness satisfying an optical resonance condition. Through an optical resonance effect, a reflective index is maximized, thereby further increasing an absorption ratio of incident light.

Specifically, the optical resonance condition is that a phase difference between a reflective light 342 and a reflective light 343 is zero or an integral multiple of a as shown in FIG. 3, i.e., to form a stationary wave. A source of the above-described phase difference includes two parts: one is a phase change θ resulted from a thickness d of a single-layer conformal dielectric layer 320, as defined by the following formula (1):

$$\theta = \frac{2\pi n_d}{\lambda} d \quad (1)$$

The other is a phase change φ caused by absorption of light by a reflective layer 330 at an interface 325 of the reflective layer 330, as defined by the following formula (2):

$$\varphi = \arctan\left(\frac{2n_d k_r}{n_d^2 - n_r^2 - k_r^2}\right) \quad (2)$$

Herein, $n_d$ denotes a refractive index of the single-layer conformal dielectric layer 320, $n_r$ and $k_r$ respectively denote a refractive index and an extinction coefficient of the reflective layer 330, and λ denotes a wavelength of the incident light. A condition for forming the stationary wave, i.e., a phase difference between the reflective light 342 and the reflective light 343 satisfies the following formula (3):

$$2\theta + \varphi = 2\pi N \quad (3)$$

wherein N is a natural number.

Further, it is known from the above-described formulas (1) to (3) that for incident lights at different angles, the optical resonance condition may be satisfied as long as the thickness d of the single-layer conformal dielectric layer 320 satisfies a particular condition, thereby significantly increasing the absorption ratio of light.

Figure 5:
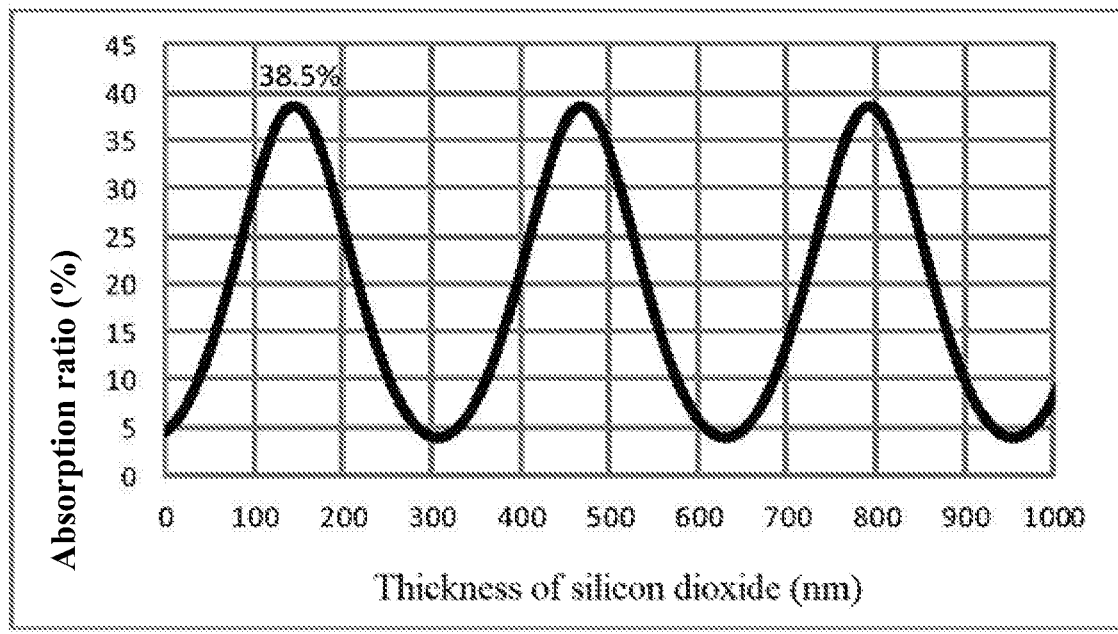
FIG. 5 shows a variation curve in an absorption ratio of a photodetector for incident light having a wavelength of 940 nm according to a thickness of a silicon dioxide dielectric layer in accordance with a second embodiment of the present application.

In one example, as shown in FIG. 4, a single-layer conformal dielectric layer 420 may specifically be a conformal silicon dioxide dielectric layer of a thickness of $d_{SiO2}$. A curvature radius R of a spherical crown structure 406 satisfies R=2215 nm. A wavelength of the incident light is 940 nm. A curve of variation of the absorption ratio of the incident light in silicon with a thickness of a silicon dioxide dielectric layer is shown as FIG. 5. It is obtained in accordance with the formula (3) that the optical resonance condition may be satisfied when $d_{SiO2}$=144.9 nm or 468.8 nm or 792.6 nm, which corresponds to an extreme value of the absorption ratio which is 38.5%. Further, it is seen from FIG. 5 that if there is not the silicon dioxide dielectric layer, the absorption ratio is only 5%. That is, the single-layer conformal dielectric layer 420 arranged in this embodiment is advantageous for improving the absorption ratio of incident light. It shall be noted that in this embodiment, the conformal silicon dioxide dielectric layer is only taken as an example for the single-layer conformal dielectric layer 420, to which the present disclosure is not limited in practice. It shall be noted that the "conformal" in the present text refers to keeping identical with a certain structure and shape. For example, the conformal dielectric layer keeps the same shape as the spherical crown silicon structure.

Compared with the existing technologies, in this embodiment, the conformal dielectric layer has a preset thickness that satisfies the optical resonance condition of incident light, so that the incident lights at different angles may form optical resonance after passing through the spherical crown silicon structure, the conformal dielectric layer and the reflective layer, which optimizes the absorption ratio of the incident light and is advantageous for using the incident light to the extreme. Further, with the pixel structure unit in this embodiment, the incident lights projecting at different angles may satisfy the condition of optical resonance through the same structure. Besides, based on the calculation formulas for θ and φ provided, it is advantageous to obtain the preset thickness of the conformal dielectric layer accurately in accordance with a relationship between θ and φ.

A third embodiment of the present disclosure relates to an image sensor. This embodiment is generally the same as the second embodiment, but differs in: in the second embodiment, the conformal dielectric layer is specifically a single-layer conformal dielectric layer; in this embodiment, the conformal dielectric layer is specifically a multilayer conformal dielectric layer and an implementation for the conformal dielectric layer is provided.

Figure 6:
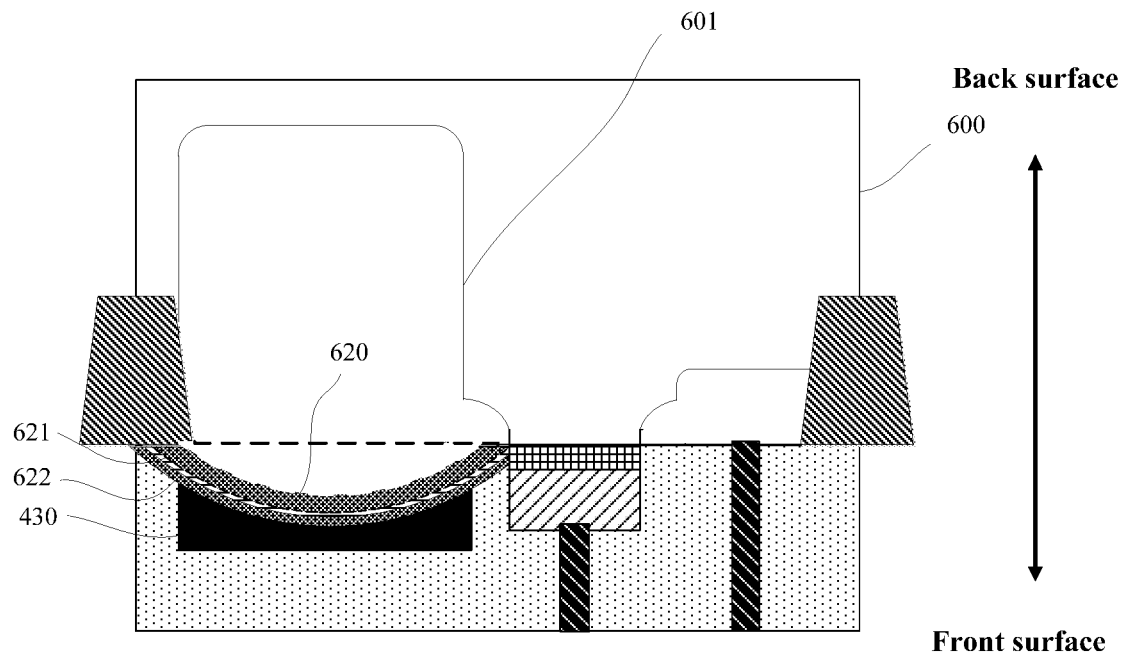
FIG. 6 shows a diagram of a pixel unit structure of an image sensor in accordance with a third embodiment of the present disclosure.
Figure 7:
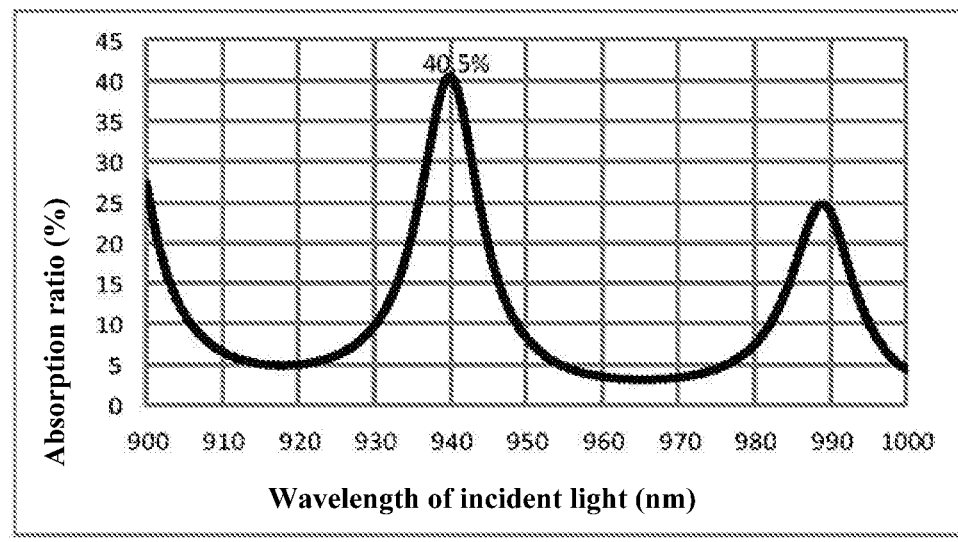
FIG. 7 shows a variation curve in absorption ratio of a photodetector for light according to a wavelength of an incident light in accordance with a third embodiment of the present application.

In the multilayer conformal dielectric layer in a pixel unit structure of the image sensor in this embodiment, refractive indexes of two neighboring conformal dielectric layers vary. That is, the conformal dielectric layer may be a structure formed by dielectric materials that have different refractive indexes and that are alternately stacked. In the following, a three-layered conformal dielectric layer is taken as an example for description. However, this disclosure is not limited to three layers in practice. The pixel unit structure of the image sensor having a three-layered conformal dielectric layer is shown in FIG. 6.

Specifically, the three-layered conformal dielectric layer may consist of: a first silicon dioxide dielectric layer 620 located on a spherical crown structure, a titanium dioxide dielectric layer 621 located on the first silicon dioxide dielectric layer 620, and a second silicon dioxide dielectric layer 622 located on the titanium dioxide dielectric layer 621. Herein, a refractive index of silicon dioxide is 1.45 and is a low-refractive-index material. A refractive index of titanium dioxide is 2.25 and is a high-refractive-index material, and a structure formed by materials that have high and low refractive indexes and that are alternately stacked is advantageous for further increasing an absorption ratio of light. It shall be noted that in this embodiment, the only the silicon dioxide and titanium dioxide are taken as an example for the dielectric material, to which the present disclosure is not limited in practice.

Further, a thickness of each layer of dielectric material satisfies an optical resonance condition of a monochromatic light of a particular wavelength. It is obtained through calculation in accordance with a resonance condition of light that when a thickness of the first silicon dioxide dielectric layer 620 is 485.8 nm, a thickness of the titanium dioxide dielectric layer is 104.5 nm, and a thickness of the second silicon dioxide dielectric layer is 144.9 nm, which may satisfy an optical resonance condition of a monochromatic light of a wavelength of 940 nm. As shown in the curve that shows change in absorption ratio of a photodetector for light in accordance with a wavelength of an incident light, the absorption ratio for light reaches a maximum value which is 40.5%.

Compared with the existing technologies, in this embodiment, the conformal dielectric layer specifically is a multilayer conformal dielectric layer, in which refractive indexes of two neighboring conformal dielectric layers vary. That is to say, the conformal dielectric layer may be a structure of dielectric materials of different refractive indexes that are alternately stacked, which is advantageous for further increasing the absorption ratio for light.

A fourth embodiment of the present disclosure relates to a manufacturing method for a pixel unit structure of an image sensor, including: providing a substrate, wherein a photodetector is formed in the substrate and a photosensitive surface of the photodetector faces a back surface of the substrate; forming a spherical crown structure on the substrate and on an opposite surface of the photosensitive surface of the photodetector, wherein the spherical crown structure and the substrate are of the same material; forming a conformal dielectric layer on the spherical crown structure; and forming a reflective layer on the conformal dielectric layer. In this way, the pixel unit structure of the image sensor as stated in the first embodiment may be manufactured.

Implementation of the manufacturing method of the pixel unit structure of the image sensor in accordance with this embodiment is described specifically in the following which are in detail provided to facilitate understanding rather than necessities for implementing this solution.

Figure 8:
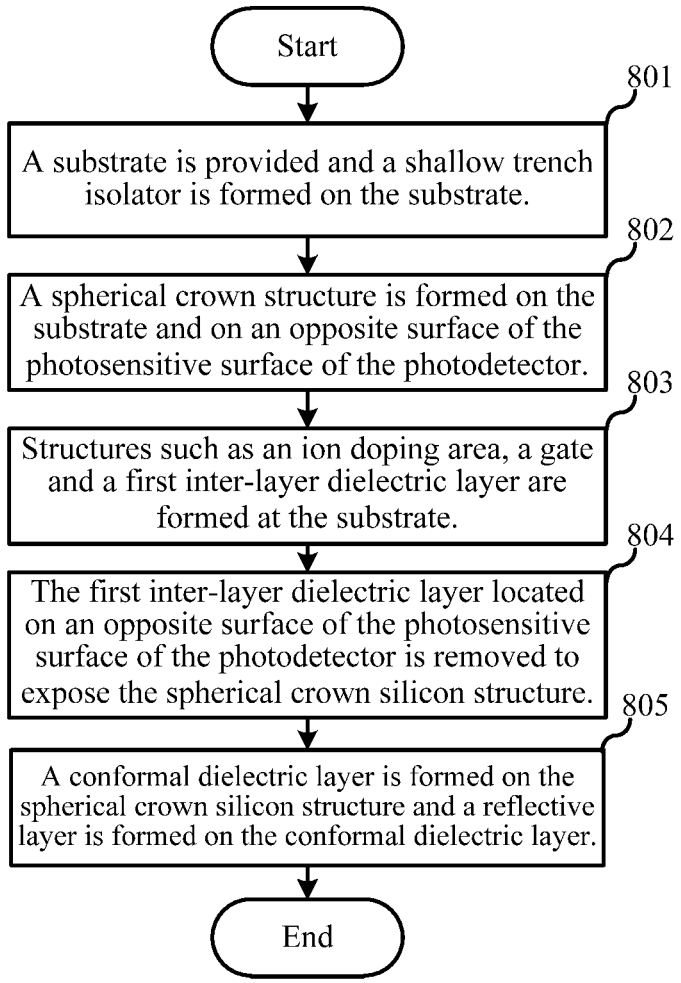
FIG. 8 shows a flowchart of a method for manufacturing an image sensor in accordance with a fourth embodiment of the present disclosure.

In the manufacturing method of the image sensor in accordance with this embodiment, the conformal dielectric layer of the pixel unit structure prepared is a single-layer conformal dielectric layer. That is, the prepared is the pixel unit structure of the image sensor in the first embodiment or the second embodiment. A specific flowchart of the manufacturing method is shown in FIG. 8, including the following steps.

In step 801, a substrate is provided and a shallow trench isolator is formed on the substrate.

Figure 9A:
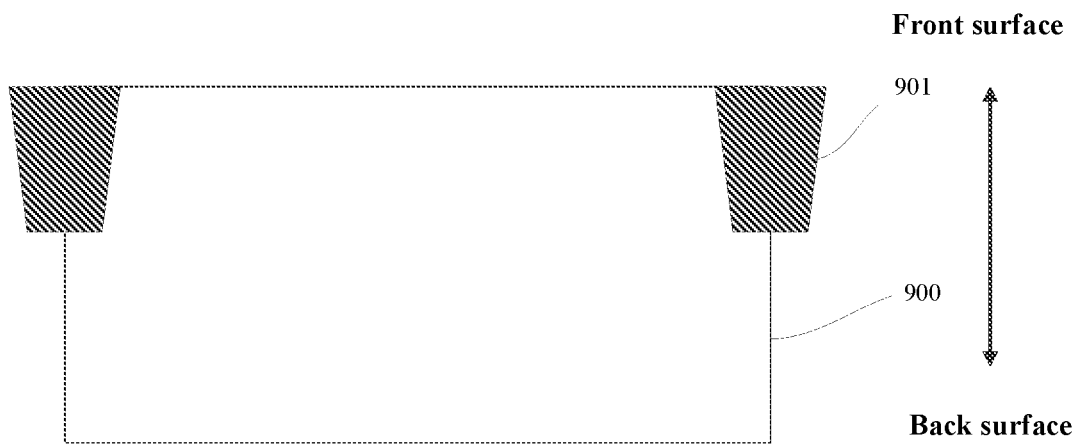
FIGS. 9a to 9f shows a structural diagram of each process step in accordance with the fourth embodiment of the present disclosure.

Specifically, with reference to FIG. 9a, a shallow trench isolator 901 is formed on both sides of a substrate 900 to isolate interference by a neighboring pixel.

In step 802, a spherical crown structure is formed on the substrate and on an opposite surface of the photosensitive surface of the photodetector.

Figure 9B:
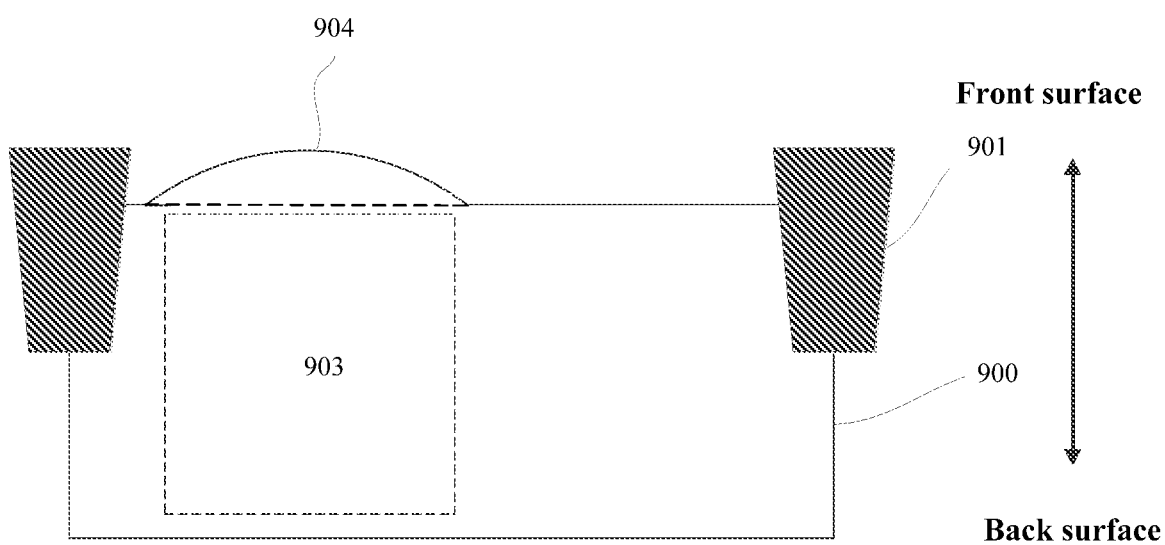

Specifically, a spherical crown silicon structure is a type of the spherical crown structure which is of the same material as the substrate. In this embodiment, a silicon substrate is taken as an example for the substrate, and the spherical crown silicon structure is taken as an example for the spherical crown structure, to which the present disclosure is not limited in practice. Specifically, a spherical crown photoresist may be formed through reflux of the photoresist or through a gray-scale mask exposure process, and then a shape and image of the spherical crown photoresist may be transferred onto the substrate through reactive ion etching. With reference to FIG. 9b, what is formed on an area of photodetector 903 is a spherical crown silicon structure 904. In this embodiment, the photodetector 903 may be a photodiode arranged in the substrate 900.

In step 803, structures such as an ion doping area, a gate and a first inter-layer dielectric layer are formed at the substrate.

Figure 9C:
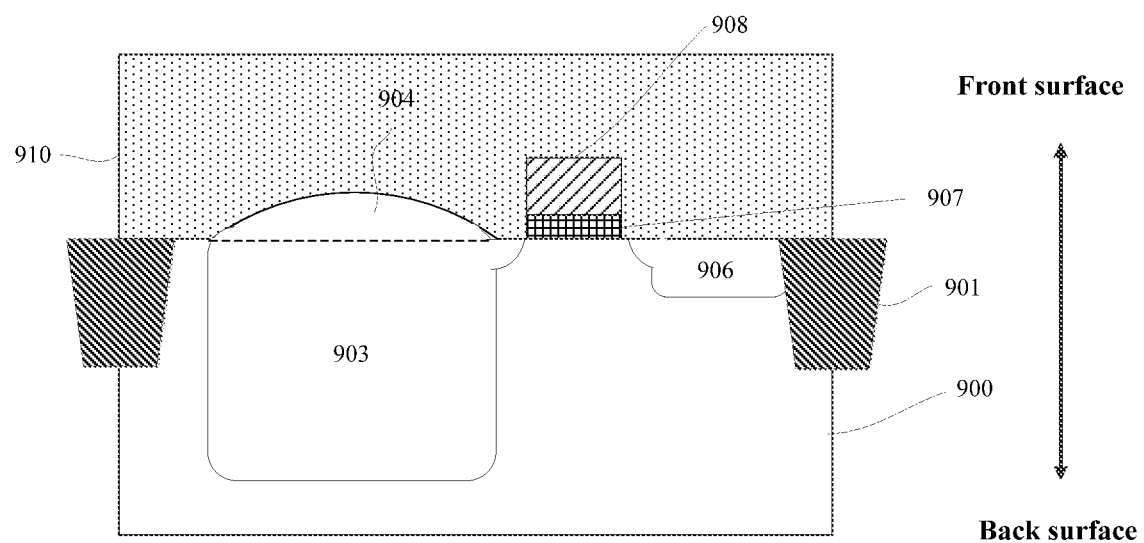

Specifically, with reference to FIG. 9c, the ion doping area formed at the substrate may include the photodetector 903 and a floating diffusion node 906, and structures such as a gate dielectric layer 907, a gate structure 908 and a first inter-layer dielectric layer 910 may be formed.

In step 804, the first inter-layer dielectric layer located on an opposite surface of the photosensitive surface of the photodetector is removed to expose the spherical crown silicon structure.

Figure 9D:
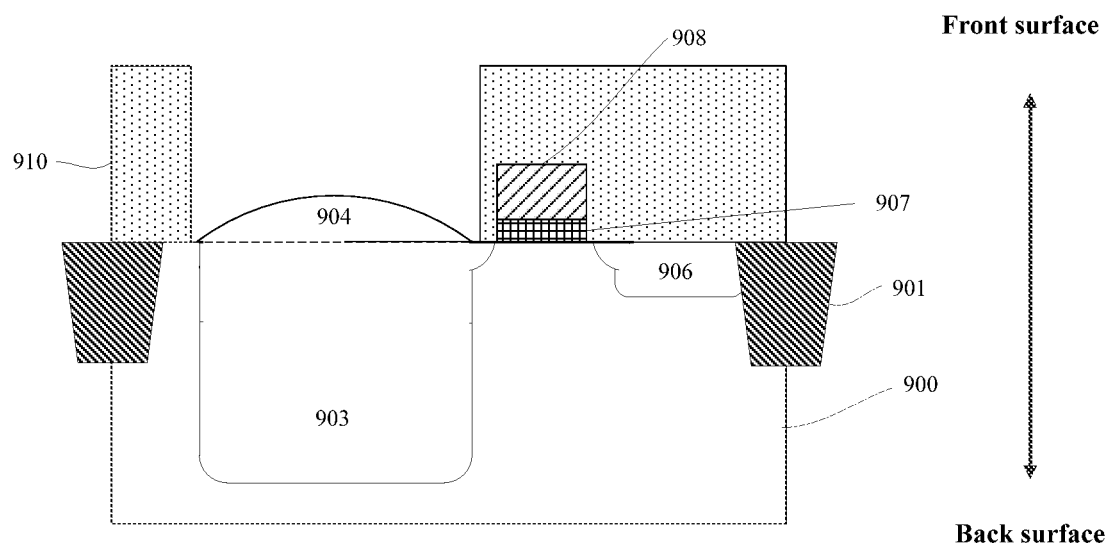

Specifically, with reference to FIG. 9d, the first inter-layer dielectric layer 910 located on an upper area of the photodetector 903 is removed to expose the spherical crown silicon structure 904.

In step 805, a conformal dielectric layer is formed on the spherical crown silicon structure and a reflective layer is formed on the conformal dielectric layer.

Figure 9E:
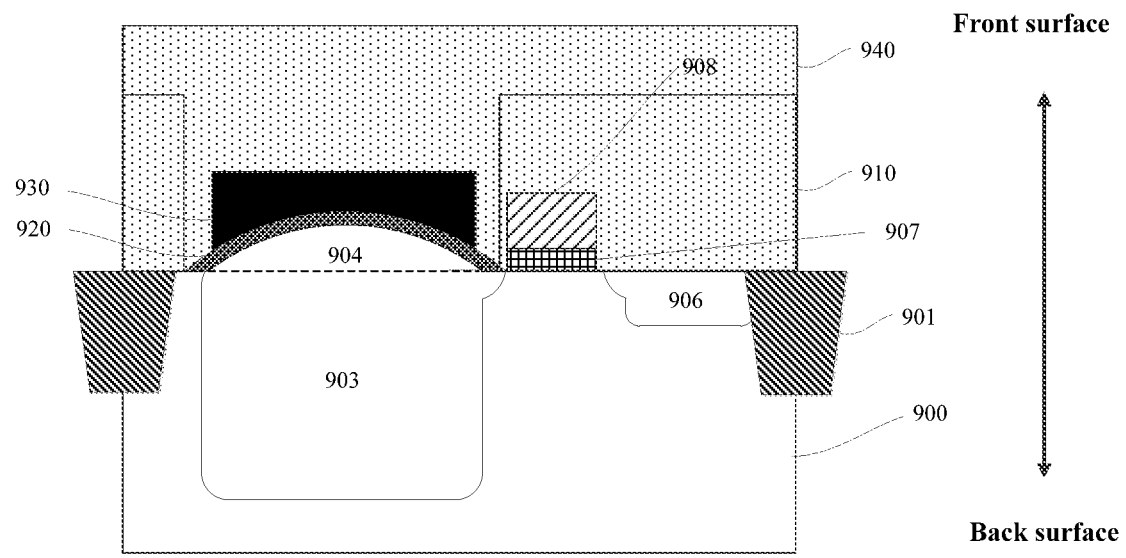

Specifically, with reference to FIG. 9e, a conformal dielectric layer 920 of a particular thickness and a reflective layer 930 are formed on the spherical crown silicon structure 904, and then a second inter-layer dielectric layer 940 is deposited and planarization is performed. Preferably, the conformal dielectric layer 920 may be of a preset thickness that satisfies an optical resonance condition whose content is described in detail in the second embodiment. The description in the second embodiment may be referred to avoid repetition in this embodiment.

Figure 9F:
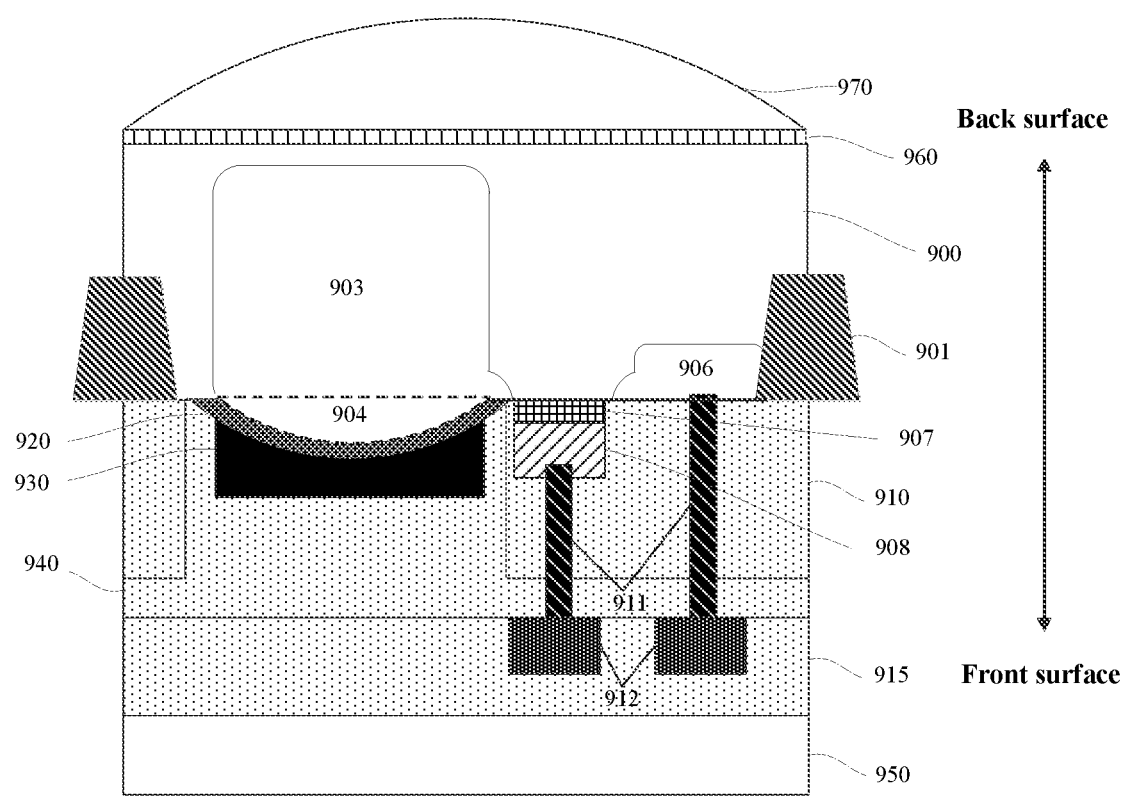

It shall be noted that after the second inter-layer dielectric layer 940 is deposited and planarized. The rest process may be completed in accordance with a process flow of a standard image sensor. With reference to FIG. 9f, the rest process includes: manufacturing of a conductive through hole 911, a metal interlink wire 912 and an inter-metal dielectric layer 915; bonding with a carrier wafer 950; reduction of a back surface of the substrate 900; and manufacturing of an anti-reflection coating and a micro-lens 970, which are standard processes for an image sensor and thus are not described here in detail.

A fifth embodiment of the present disclosure relates to a manufacturing method for an image sensor. This embodiment is generally the same as the fourth embodiment. A difference lies in: the conformal dielectric layer in the pixel unit structure of the image sensor prepared in the fourth embodiment is single-layered, while the conformal dielectric layer in the pixel unit structure of the image sensor prepared in this embodiment is multilayer, i.e., this embodiment provides a method for preparing the pixel unit structure of the image sensor in the third embodiment.

Figure 10:
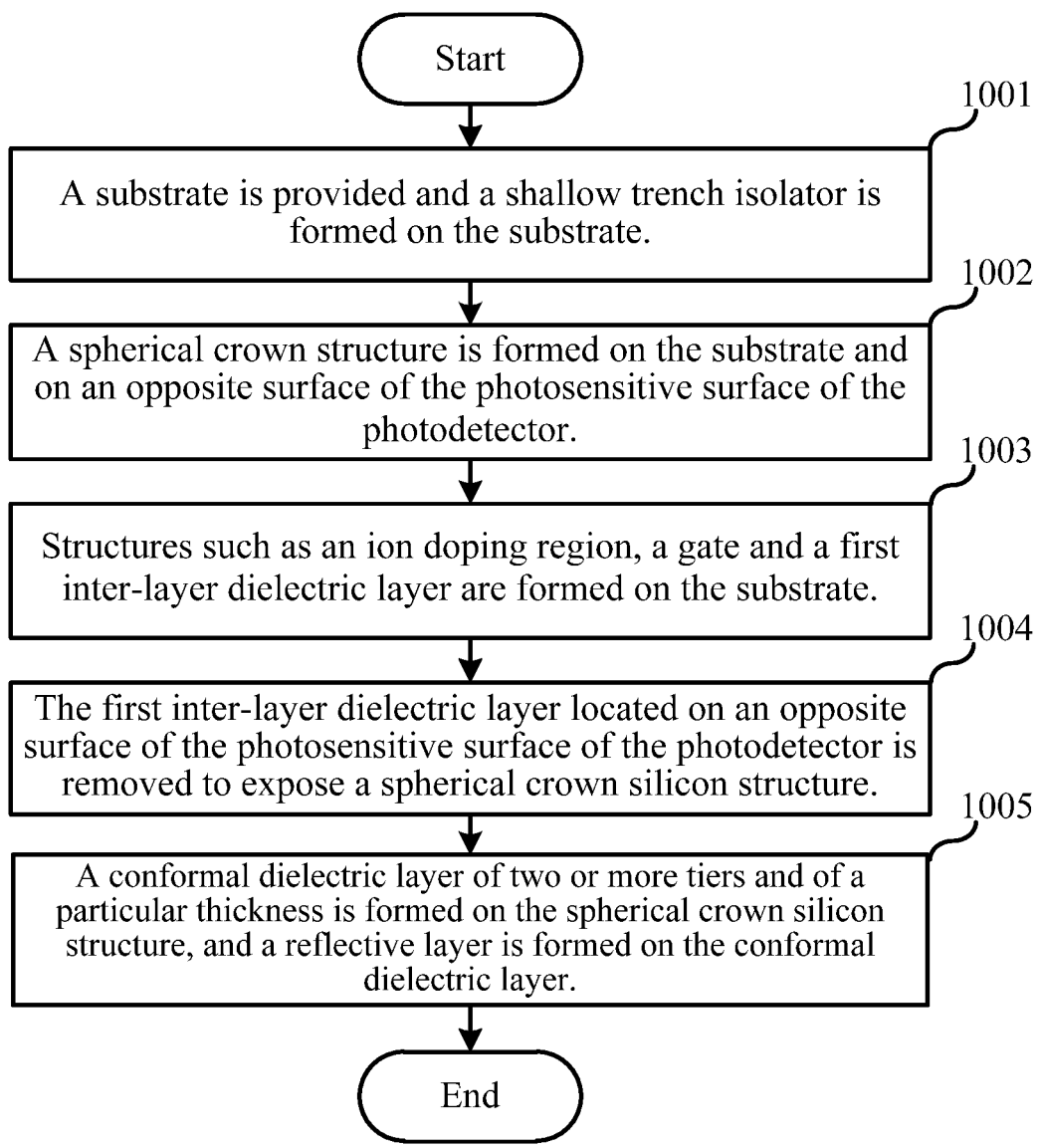
FIG. 10 shows a flowchart of a method for manufacturing an image sensor in accordance with a fifth embodiment of the present disclosure.

A flowchart of a method for manufacturing the image sensor in this embodiment is shown in FIG. 10, including the following steps.

In step 1001, a substrate is provided and a shallow trench isolator is formed on the substrate.

In step 1002, a spherical crown structure is formed on the substrate and on an opposite surface of the photosensitive surface of the photodetector.

In step 1003, structures such as an ion doping area, a gate and a first inter-layer dielectric layer are formed on the substrate.

In step 1004, the first inter-layer dielectric layer located on an opposite surface of the photosensitive surface of the photodetector is removed to expose a spherical crown silicon structure.

Step 1001 to step 1004 are generally the same as steps 801 to 804 and thus are not repeated here.

In step 1005, a conformal dielectric layer of two or more layers and of a particular thickness is formed on the spherical crown silicon structure, and a reflective layer is formed on the conformal dielectric layer.

Specifically, the conformal dielectric layer of two or more layers is a structure alternately stacked by materials of high and low refractive indexes. A three-layered conformal dielectric layer is taken as an example for description. To begin with, thicknesses of conformal dielectric layers of three different dielectric materials may be obtained in accordance with a resonance condition of light. When forming a three-layered conformal dielectric layer of a particular thickness, a first silicon diode dielectric layer is formed on the spherical crown silicon structure, then a titanium dioxide dielectric layer is formed on the first silicon diode dielectric layer, and then a second silicon diode dielectric layer is formed on the titanium dioxide dielectric layer, so that the stacked three-layered conformal dielectric layer is formed. Finally, the reflective layer is formed on the second silicon diode dielectric layer. It shall be noted that in this embodiment, the silicon diode and the titanium dioxide are taken as an example for different dielectric materials, to which the present disclosure is not limited in practice.

It shall be noted that after step 1005, the rest process may be completed in accordance with a process flow of a standard image sensor with reference two steps after step 805 in the fourth embodiment, which is not described in detail to avoid repetition.

It shall be appreciated that a single pixel structure is taken as a descried object in the above-described method. Boundaries of a substrate 900 displayed in FIGS. 9a-9f are not real boundaries of the substrate.

The steps set in the above-described methods only aim to make the description clearer. In implementation, the steps may be combined into one or one step may be divided into multiple steps, which all fall into the protection scope of the present disclosure as long as the same logical relationship is included. Such a trivial amendment or design added to an algorithm or procedure as not changing the algorithm or a central design of the procedure falls into the protection scope of the disclosure.

Those skilled in the art shall appreciate that the above-described embodiments are specific embodiments for implementing the present invention. In practice, however, many changes can be made in the forms and details of the specific embodiments without departing from the spirit and scope of the disclosure.

What is claimed is:

1. An image sensor, comprising a substrate and at least one pixel unit, wherein the pixel unit comprises:
    a photodetector arranged in the substrate, a photosensitive surface of the photodetector facing a back surface of the substrate to generate a charge upon receiving an incident light from the back surface of the substrate;
    a spherical crown structure arranged on the substrate and located on an opposite surface of the photosensitive surface;
    a conformal dielectric layer arranged on the spherical crown structure and used to generate a dielectric-layer reflective light when the incident light reaches the conformal dielectric layer; and
    a reflective layer arranged on the conformal dielectric layer and used to generate a reflective-layer reflective light when the incident light reaches the reflective layer;
    wherein the conformal dielectric layer has a preset thickness satisfying an optical resonance condition of the incident light, and the optical resonance condition is:
    a phase θ of the dielectric-layer reflective light and a phase φ of the reflective-layer reflective light satisfy the formula of:

$2\theta + \varphi = 2\pi N$;

wherein N denotes a natural number.

2. The image sensor according to claim 1, wherein the conformal dielectric layer is a multilayer conformal dielectric layer; wherein refractive indexes of two adjacent conformal dielectric layers are different.

3. The image sensor according to claim 2, wherein the multilayer conformal dielectric layer is a three-layered conformal dielectric layer; wherein the three-layered conformal dielectric layer consists of:
    a first silicon dioxide dielectric layer located on the spherical crown structure;
    a titanium dioxide dielectric layer located on the first silicon dioxide dielectric layer; and
    a second silicon dioxide dielectric layer located on the titanium dioxide dielectric layer.

4. The image sensor according to claim 1, wherein the phase θ of the dielectric-layer reflective light and the phase φ of the reflective-layer reflective light are specifically calculated by the formulas of:

$$\theta = \frac{2\pi n_d}{\lambda} d, \text{ and}$$

$$\varphi = \arctan\left(\frac{2 n_d k_r}{n_d^2 - n_r^2 - k_r^2}\right);$$

wherein d denotes the preset thickness of the conformal dielectric layer, $n_d$ denotes a refractive index of the conformal dielectric layer, and λ denotes a wavelength of the incident light; $n_r$ denotes a refractive index of the reflective layer, and $k_r$ denotes an extinction coefficient of the reflective layer.

5. The image sensor according to claim 1, wherein the spherical crown structure is a spherical crown silicon structure.

6. The image sensor according to claim 1, further comprising:
    a gate structure of a transmission transistor, wherein the gate structure is arranged on a gate dielectric layer arranged on the substrate, wherein the transmission transistor is configured to control transmission of a charge generated by the photodetector to a floating diffusion node, and the gate structure is a switch to control charge transmission; and
    the floating diffusion node arranged in the substrate, wherein the floating diffusion node is configured to store a received charge and convert the stored charge to a voltage signal.

7. The image sensor according to claim 1, further comprising:
    a shallow trench isolator arranged on both sides of the substrate, wherein the shallow trench isolator is configured to isolate interference from a neighboring pixel unit structure.

8. The image sensor according to claim 1, wherein the incident light is a near-infrared monochromatic light.

9. The image sensor according to claim 1, wherein the spherical crown structure and the substrate are of the same material.

10. The image sensor according to claim 9, wherein the photodetector is a photodiode.

11. A method for manufacturing an image sensor, comprising:
    providing a substrate, wherein a photodetector is formed in the substrate and a photosensitive surface of the photodetector faces a back surface of the substrate;
    forming a spherical crown structure on the substrate and on an opposite surface of the photosensitive surface of the photodetector; wherein the spherical crown structure and the substrate are of the same material;
    forming a conformal dielectric layer on the spherical crown structure; and
    forming a reflective layer on the conformal dielectric layer;
    wherein the conformal dielectric layer has a preset thickness satisfying an optical resonance condition of the incident light, and the optical resonance condition is:
    a phase θ of the dielectric-layer reflective light and a phase φ of the reflective-layer reflective light satisfy the formula of:

$2\theta + \varphi = 2\pi N$;

wherein N denotes a natural number.

12. The method according to claim 11, wherein the forming of a spherical crown structure on the substrate and on an opposite surface of the photosensitive surface of the photodetector specifically comprises:
forming a spherical crown photoresist through reflux of the photoresist or through a gray-scale mask exposure process;
transferring the spherical crown photoresist into the substrate through reactive ion etching;
forming a first inter-layer dielectric layer on the substrate;
removing the first inter-layer dielectric layer located on an upper area of the opposite surface of the photosensitive surface of the photodetector, so as to expose the spherical crown structure.

13. The method according to claim 12, after the forming of a reflective layer on the conformal dielectric layer, further comprising:
depositing a second inter-layer dielectric layer on the reflective layer and performing planarization.

14. The method according to claim 11, after the forming of a photodetector in the substrate, further comprising:
forming a floating diffusion node in the substrate, and forming a gate structure of a transmission transistor on the substrate.

15. The method according to claim 11, before the forming of a photodetector in the substrate, further comprising:
forming a shallow trench isolator on both sides of the substrate.

16. The method according to claim 11, wherein the conformal dielectric layer is a multilayer conformal dielectric layer; wherein refractive indexes of two adjacent conformal dielectric layers are different.

17. The method according to claim 16, wherein the multilayer conformal dielectric layer is a three-layered conformal dielectric layer; wherein the three-layered conformal dielectric layer consists of:
a first silicon dioxide dielectric layer located on the spherical crown structure;
a titanium dioxide dielectric layer located on the first silicon dioxide dielectric layer; and
a second silicon dioxide dielectric layer located on the titanium dioxide dielectric layer.

18. The method according to claim 11, wherein the conformal dielectric layer has a preset thickness that satisfies an optical resonance condition of a preset monochromatic light.

19. A method for manufacturing an image sensor, comprising:
providing a substrate, wherein a photodetector is formed in the substrate and a photosensitive surface of the photodetector faces a back surface of the substrate;
forming a spherical crown photoresist through reflux of the photoresist or through a gray-scale mask exposure process;
transferring the spherical crown photoresist into the substrate through reactive ion etching;
forming a first inter-layer dielectric layer on the substrate;
removing the first inter-layer dielectric layer located on an upper area of the opposite surface of the photosensitive surface of the photodetector, so as to expose a spherical crown structure; wherein the spherical crown structure and the substrate are of the same material;
forming a conformal dielectric layer on the spherical crown structure; and
forming a reflective layer on the conformal dielectric layer.

20. The method according to claim 19, after the forming of a reflective layer on the conformal dielectric layer, further comprising:
depositing a second inter-layer dielectric layer on the reflective layer and performing planarization.

* * * * *